(12) United States Patent
Baba

(10) Patent No.: US 6,294,961 B1
(45) Date of Patent: Sep. 25, 2001

(54) SELECTABLE VOLTAGE-CONTROLLED OSCILLATION CIRCUIT

(75) Inventor: Toshiki Baba, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/593,514

(22) Filed: Jun. 14, 2000

(30) Foreign Application Priority Data

Jun. 16, 1999 (JP) .................................................. 11-169781

(51) Int. Cl.$^7$ ....................................................... H03B 5/12
(52) U.S. Cl. ..................... 331/49; 331/117 R; 331/167; 331/177 V
(58) Field of Search ................................... 331/49, 117 R, 331/117 D, 117 FE, 167, 173, 177 V

(56) References Cited

U.S. PATENT DOCUMENTS 4,063,196 * 12/1977 Larson et al. ..................... 331/117 R
5,627,498 * 5/1997 Meyer ............................... 331/117 R
5,920,236 * 7/1999 Ishizaki ............................. 331/117 R
5,999,061 * 12/1999 Pope et al. ............................. 331/49

FOREIGN PATENT DOCUMENTS 11-88050    3/1999 (JP) .

* cited by examiner

Primary Examiner—Siegfried H. Grimm
(74) Attorney, Agent, or Firm—Brinks Hofer Gilson & Lione

(57) ABSTRACT

A selectable oscillation circuit includes a first oscillation circuit, a second oscillation circuit, and a selector circuit. The selector circuit selectively switches on and off the first oscillation circuit and the second oscillation circuit, in accordance with the provision of a selector signal, to selectively switch between two communicating modes, with low-power consumption.

5 Claims, 2 Drawing Sheets

SELECTABLE VOLTAGE-CONTROLLED OSCILLATION CIRCUIT

BACKGROUND OF THE INVENTION

1. Field of the Invention

The present invention relates to selectable oscillation circuits and, more particularly, relates to a selectable oscillation circuit that achieves low power consumption by reducing the amount of current that flows through the inactivated oscillation circuit, when either of two oscillation circuits is inactivated using a selector circuit.

2. Description of the Related Art

Among the mobile communication systems used worldwide, Digital Cellular System ("DCS") is employed in the United Kingdom, Germany, France, and part of Asia, and Global System for Mobile Communications ("GSM"), which was adopted as an European standard method for digital cellular phones in 1982, is employed in Europe, the United States, Africa, and part of Asia.

DCS has 374 working channels and employs Gaussian Minimum Shift Keying ("GMSK") modulation method. In DCS, a frequency band of 1805 MHz to 1880 MHz is assigned to a base station, a frequency band of 1710 MHz to 1785 MHz is assigned to a mobile station, and a 1700 MHz oscillation frequency is assigned to the voltage-controlled oscillator ("VCO") of the cellular phone. GSM has 124 working channels and employs GMSK as a modulation method. In GSM, a frequency band of 925 MHz to 960 MHz is assigned to a base station, a frequency band of 880 MHz to 915 MHz is assigned to a mobile station, and a 900 MHz oscillation frequency is assigned to the VCO of the cellular phone.

Since these two mobile communication systems, DCS and GSM, employ different communication methods, two cellular phones are required in order to subscribe to both DCS and GSM mobile communication systems: a cellular phone adopting the DCS method and a cellular phone adopting the GSM method.

However, since both DCS and GSM methods employ GMSK modulation method, and only their assigned operating frequencies are different, there has been proposed a cellular phone that can be used for both DCS and GSM modes. In this cellular phone, there is provided a selectable oscillation circuit that has a first voltage-controlled oscillation circuit oscillating at 1700 MHz, a second voltage-controlled oscillation circuit oscillating at 900 MHz, and a selector circuit. This cellular phone is controlled so as to select and properly use one of the two voltage-controlled oscillation circuits, in accordance with a control signal from the selector circuit.

In this cellular phone, having both DCS and GSM modes, when mobile communication is performed using DCS method, by causing the selector circuit to activate the first voltage-controlled oscillation circuit and to inactivate the second voltage-controlled oscillation circuit, the oscillation output can be obtained from the first voltage-controlled oscillation circuit. On the other hand, when mobile communication is performed using GSM method, by causing the selector circuit to inactivate the first voltage-controlled oscillation circuit and to activate the second voltage-controlled oscillation circuit, the oscillation output can be obtained from the second voltage-controlled oscillation circuit.

FIG. 2 shows one example of a conventional selectable oscillation circuit in a cellular phone having both DCS and GSM modes. As shown in FIG. 2, the selectable oscillation circuit includes a first voltage-controlled oscillation circuit 21 oscillating at 1700 MHz, a second voltage-controlled oscillation circuit 22 oscillating in the 900 MHz band, a selector circuit 23, a first oscillation-signal output terminal 24, a second oscillation-signal output terminal 25, a selector-signal supply terminal 26, a first selector terminal 27, a second selector terminal 28, a power supply terminal 29, a first frequency-setting voltage supply terminal 30, and a second frequency setting voltage-supply terminal 31.

The first voltage-controlled oscillation circuit 21 includes a first oscillation transistor $21_1$, an emitter load resistor $21_2$, a varactor diode $21_3$, an inductor $21_4$, coupling capacitors $21_5$ and $21_6$, a direct-current-decoupling capacitor $21_7$, a buffer resistor $21_8$, base-bias resistors $21_9$ and $21^{10}$, and a bypass capacitor $21_{11}$. These circuit elements $21_1$ to $21_{11}$ are interconnected as shown in FIG. 2. The varactor diode $21_3$ and the inductor $21_4$ mainly constitute a first resonator circuit that determines the oscillation frequency of the first voltage-controlled oscillation circuit 21. A predetermined frequency of 1700 MHz, which is obtained by changing a first frequency-setting voltage provided via the first frequency-setting voltage-supply terminal 30 to the varactor diode $21_3$, is set as the resonant frequency of the first resonant circuit.

The second voltage-controlled oscillation circuit 22, which has substantially the same construction as the above-described oscillation circuit 21, includes a second oscillation transistor $22_1$, an emitter load resistor $22_2$, a varactor diode $22_3$, an inductor $22_4$, coupling capacitors $22_5$ and $22_6$, a direct-current-decoupling capacitor $22_7$, a buffer resistor $22_8$, base-bias resistors $22_9$ and $22_{10}$, and a bypass capacitor $22_{11}$. These circuit elements $22_1$ to $22_{11}$ are interconnected as shown in FIG. 2. The varactor diode $22_3$ and the inductor $22_4$ mainly constitute a second resonator circuit that determines the oscillation frequency of the second voltage-controlled oscillation circuit 22. A predetermined frequency of 900 MHz, which is obtained by changing a second frequency-setting voltage provided via the second frequency-setting voltage-supply terminal 31 to the varactor diode $22_3$, is set as the resonant frequency of the second resonant circuit.

The selector circuit 23 includes a first switching transistor $23_1$, a second switching transistor $23_2$, and resistors $23_3, 23_4$, $23_5, 23_6$, and $23_7$, which are connected as shown in FIG. 2.

The conventional selectable oscillation circuit having the above-described construction operates as follows. In the cellular phone, when mobile communication is performed using the DCS method, a HIGH-level (saturated) selector signal is provided to the selector-signal supply terminal 26 of the selector circuit 23, which switches the first switching transistor $23_1$ on and the second switching transistor $23_2$ off. At this time, the emitter load resistor $21_2$ connected to the first oscillation transistor $21_1$ is grounded via the collector-emitter path of the first switching transistor $23_1$, which allows an operating current to flow through the collector-emitter path of the first oscillation transistor $21_1$. Accordingly, normal oscillation occurs in the first voltage-controlled oscillation circuit 21. The first oscillation signal, whose oscillation frequency is at 1700 MHz, is provided from the emitter of the first oscillation transistor $21_1$ via the coupling capacitor $21_6$ to the first oscillation-signal output terminal 24. Finally, the first oscillation signal is provided to an application circuit (not shown). At this time, since the second switching transistor $23_2$ is switched off, the emitter load resistor $22_2$ connected to the second oscillation transistor $22_1$ is not grounded, which prevents an operating current from flowing via the collector-emitter path of the second oscillation transistor $22_1$. Accordingly, the second voltage-controlled oscillation circuit 22 does not oscillate.

On the other hand, when mobile communication is performed using the GSM method, a LOW-level selector signal (non-conducting) is provided to the selector-signal supply terminal 26 of the selector circuit 23, which switches the first switching transistor $23_1$ off and the second switching transistor $23_2$ on. At this time, since the second switching transistor $23_2$ is switched on, the emitter load resistor $22_2$ connected to the second oscillation transistor $22_1$ is grounded via the collector-emitter path of the second switching transistor $23_2$, which allows the operating current to flow through the collector-emitter path of the second oscillation transistor $22_1$. Accordingly, normal oscillation occurs in the second voltage-controlled oscillation circuit 22. The second oscillation signal, whose oscillation frequency is at 900 MHz, is provided from the emitter of the second oscillation transistor $22_1$, via the coupling capacitor $22_6$ to the second oscillation-signal output terminal 25. Finally, the second oscillation signal is provided from the second oscillation-signal output terminal 25 to the application circuit (not shown). At this time, since the first switching transistor $23_1$ is switched off, the emitter load resistor $21_2$connected to the first oscillation transistor $21_1$ is not grounded, which prevents the operating current from flowing via the collector-emitter path of the first oscillation transistor $21_1$. Therefore, the first voltage-controlled oscillation circuit 21 stops oscillating.

Thus, by providing a HIGH-level or a LOW-level selector signal to the selector-signal supply terminal 26, either the first voltage-controlled oscillation circuit 21 or the second voltage-controlled oscillation circuit 22 is selectively activated. Accordingly, the first oscillation signal or the second oscillation signal can be selectively output.

In accordance with whether the selector signal provided to the selector circuit 23 is HIGH or LOW, one (for example, the first voltage-controlled oscillation circuit 21) of the two voltage-controlled oscillation circuits 21 and 22 is activated and the other (for example, the second voltage-controlled oscillation circuit 22) is inactivated. In this case, when the second switching transistor $23_2$ is switched off, since no operating current flows via the collector-emitter path of the second oscillation transistor $22_1$, there is no power consumption due to the operating current flowing via the collector-emitter path. However, regardless of whether or not the second oscillation transistor $22_1$ is active, some bias-setting currents continue to flow via the base-bias resistors $22_9$ and $22_{10}$, and the internal battery of the cellular phone is drained quickly.

SUMMARY OF THE INVENTION

Accordingly, in view of the foregoing technical background, one aspect of the present invention is to provide a selectable oscillation circuit for substantially reducing the power consumption in an inactive oscillation circuit.

According to the presently preferred embodiment of the present invention, a selectable oscillation circuit includes a first oscillation circuit including a first oscillation transistor, a second oscillation circuit including a second oscillation transistor, and a selector circuit including a first selector terminal connected to the first oscillation circuit and a second selector terminal connected to the second oscillation circuit. The selector circuit selectively switches on and off the first oscillation circuit and the second oscillation circuit in accordance with the provision of a selector signal. In the selectable oscillation circuit, the first selector terminal is connected to the grounding terminal of an emitter load resistor and the grounding terminal of a base-bias resistor of the first oscillation transistor, and the second selector terminal is connected to the grounding terminal of an emitter load resistor and a grounding terminal of a base-bias resistor of the second oscillation transistor.

When the first oscillation transistor is switched off, the current flowing via the first oscillation circuit is reduced. In the same manner, when the second oscillation transistor is switched off, the current flowing via the second oscillation circuit is reduced. Therefore, since unnecessary power consumption is suppressed, the battery loss is minimized.

Further objects, features, and advantages of the present invention will become apparent from the following description of the preferred embodiments with reference to the attached drawings.

DETAILED DESCRIPTION OF THE INVENTION

The presently preferred embodiment of the present invention is described with reference to the attached drawing.

Figure 1:
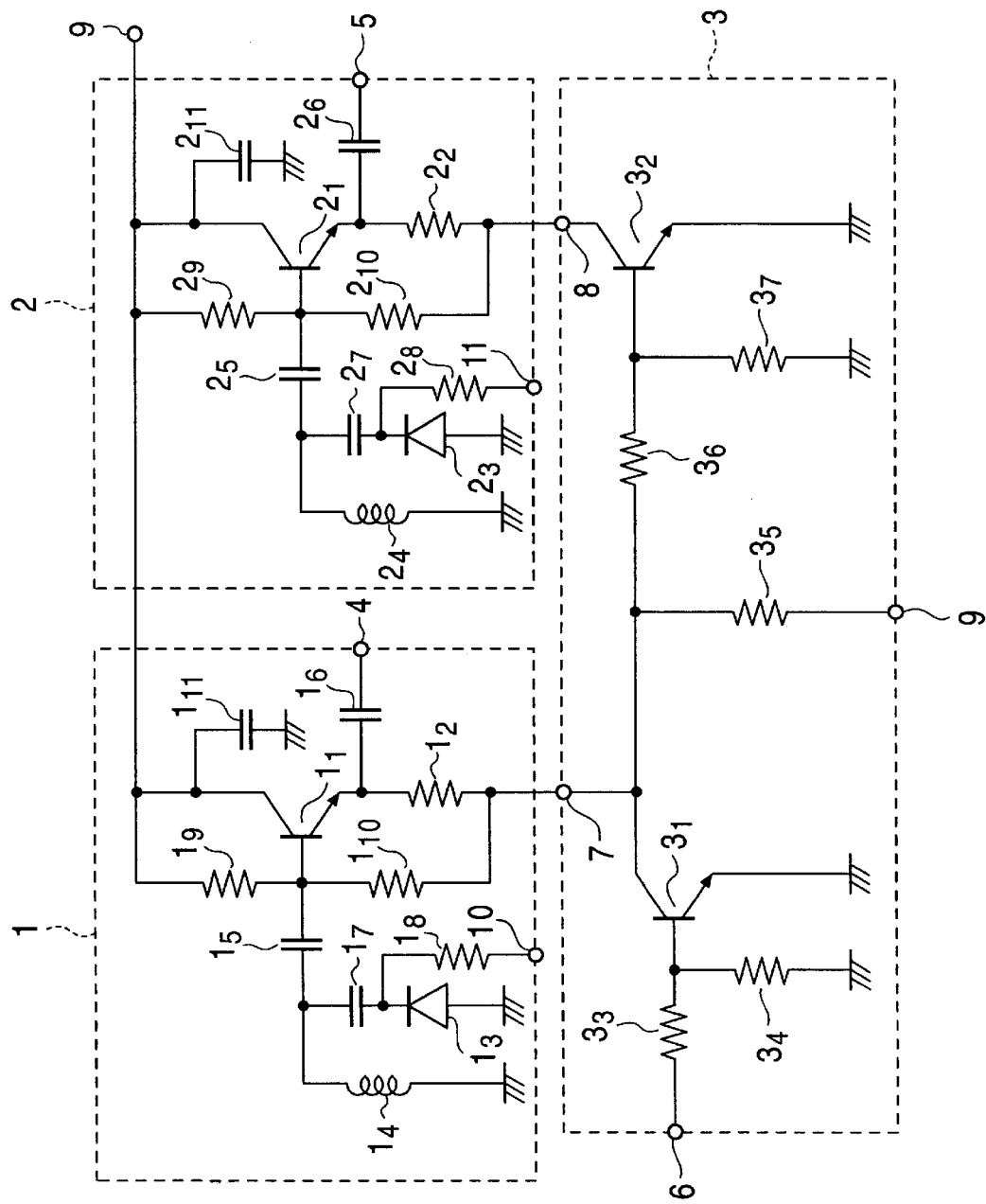
FIG. 1 is a circuit diagram of a selectable oscillation circuit according to one embodiment of the present invention.
Figure 2:
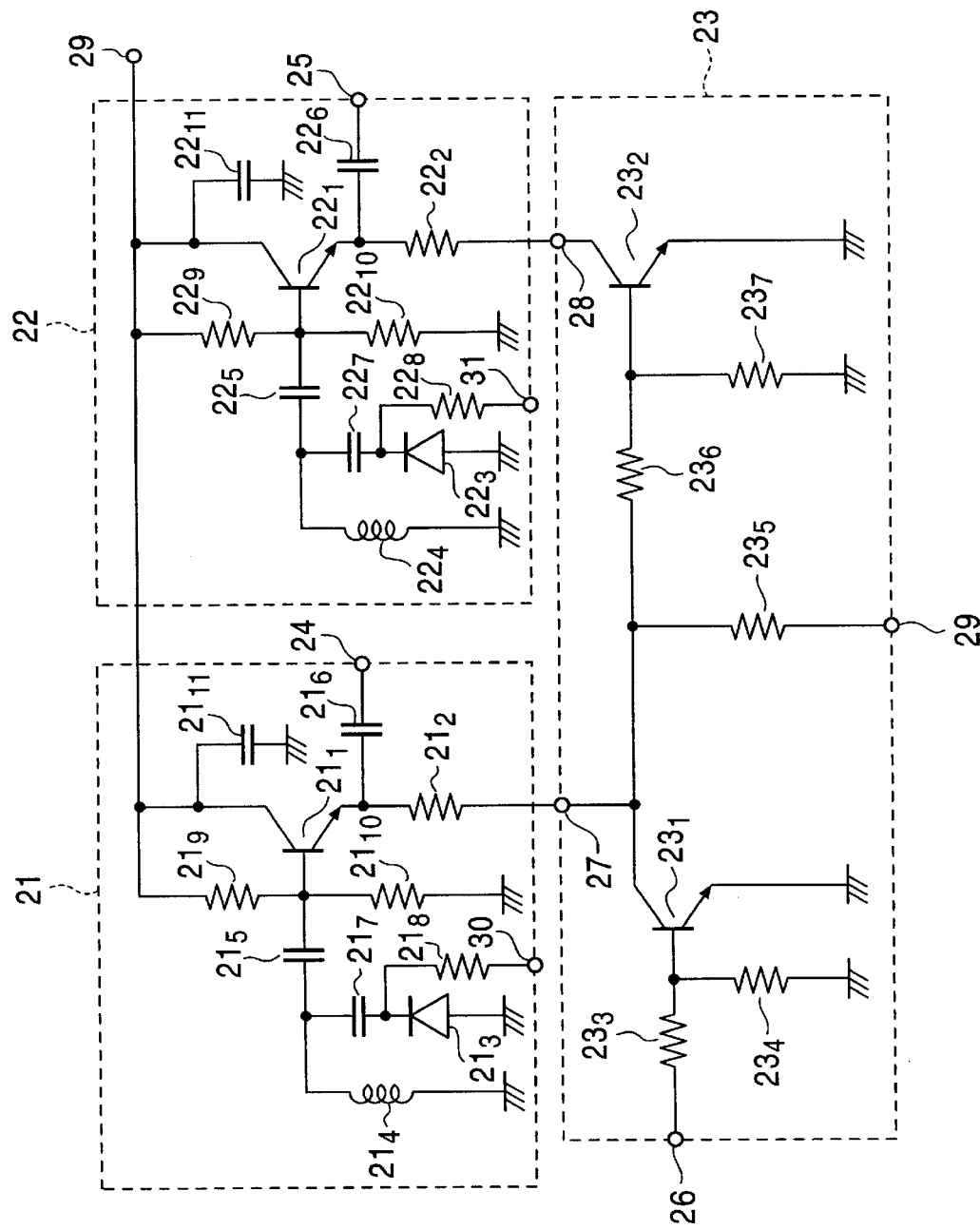
FIG. 2 is a circuit diagram of a conventional selectable oscillation circuit.

FIG. 1 shows the presently preferred embodiment of a selectable oscillation circuit according to the present invention, which may be used in a cellular phone having both DCS and GSM modes. As shown in FIG. 1, the selectable oscillation circuit according to the presently preferred embodiment of the present invention includes a first voltage-controlled oscillation circuit 1 oscillating, preferably, at 1700 MHz, a second voltage-controlled oscillation circuit 2 oscillating, preferably, at 900 MHz, a selector circuit 3, a first oscillation-signal output terminal 4, a second oscillation-signal output terminal 5, a selector-signal supply terminal 6, a first selector terminal 7, a second selector terminal 8, a power supply terminal 9, a first frequency-setting voltage-supply terminal 10, and a second frequency-setting voltage-supply terminal 11.

The first voltage-controlled oscillation circuit 1 includes a first oscillation transistor $1_1$, an emitter load resistor $1_2$, a varactor diode $1_3$, an inductor $1_4$, coupling capacitors $1_5$ and $1_6$, a direct-current-decoupling capacitor $1_7$, a buffer resistor $1_8$, base-bias resistors $1_9$ and $1_{10}$, and a bypass capacitor $1_{11}$. These circuit elements $1_1$ to $1_{11}$ are interconnected as shown in FIG. 1. The varactor diode $1_3$ and the inductor $1_4$ mainly constitute a first resonator circuit that determines the oscillation frequency of the first voltage-controlled oscillation circuit 1. A predetermined frequency of 1700 MHz, which is obtained by changing a negative-HIGH first frequency-setting voltage provided via the buffer resistor $1_8$ from the first frequency-setting voltage-supply terminal 10 to the varactor diode $1_3$, is selectively set as the resonant frequency of the first resonant circuit.

The second voltage-controlled oscillation circuit 2, which has substantially the same construction as the above-described oscillation circuit 1, includes a second oscillation transistor $2_1$, an emitter load resistor $2_2$, a varactor diode $2_3$, an inductor $2_4$, coupling capacitors $2_5$ and $2_6$, a directcurrent-decoupling capacitor $2_7$, a buffer resistor $2_8$, base-bias resistors $2_9$ and $2_{10}$, and a bypass capacitor $2_{11}$. These circuit elements $2_1$ to $2_{11}$ are interconnected as shown in FIG. 1. The varactor diode $2_3$ and the inductor $2_4$ mainly constitute a second resonator circuit that determines the oscillation frequency of the second voltage-controlled oscillation circuit 2. A predetermined frequency of 900 MHz which is obtained by changing a negative-HIGH second frequency-setting voltage provided via the buffer resistor $2_8$ from the second frequency-setting voltage-supply terminal 11 to the varactor diode $2_3$, is selectively set as the resonant frequency of the second resonant circuit.

The selector circuit 3 includes a first switching transistor $3_1$, a second switching transistor $3_2$, and resistors $3_3$, $3_4$, $3_5$, $3_6$, and $3_7$, which are coupled as shown in FIG. 1. The resistors $3_3$ and $3_4$ are base-bias resistors for the first switching transistor $3_1$, and the resistors $3_5$, $3_6$, and $3_7$ are base-bias resistors for the second switching transistor $3_2$.

The selectable oscillation circuit according to the presently preferred embodiment having the above-described construction operates as follows. In this cellular phone, when mobile communication is performed using the DCS method, in other words, when the selector circuit 3 is selected so that the selectable oscillation circuit operates at 1700 MHz, a positive-HIGH selector signal is generated by a control unit (not shown), and is provided to the selector-signal supply terminal 6 of the selector circuit 3. When the selector circuit 3 receives the positive-HIGH selector signal, the first switching transistor $3_1$ is switched on and the second switching transistor $3_2$ is switched off. At this time, since the first switching transistor $3_1$ is switched on, some currents flow through the emitter load resistor $1_2$ and the base-bias resistors $1_9$ and $1_{10}$. The currents that flow via the two base-bias resistors $1_9$ and $1_{10}$ cause a proper base-bias voltage to be applied to the base of the first oscillation transistor $1_1$. Because of the application of the proper base-bias voltage, an operating current flows via the collector-emitter path of the first oscillation transistor $1_1$. Accordingly, normal oscillation occurs in the first voltage-controlled oscillation circuit 1. The first oscillation signal, whose oscillation frequency is at 1700 MHz, is provided from the emitter of the first oscillation transistor $1_1$ via the coupling capacitor 16 to the first oscillation-signal output terminal 4. Finally, the first oscillation signal is provided to an application circuit (not shown).

At this time, since the second switching transistor $3_2$ is switched off, no current flows through either the emitter load resistor $2_2$ or the base-bias resistors $2_9$ and $2_{10}$. Since no current flows through the base-bias resistors $2_9$ and $2_{10}$, a proper base-bias voltage is not applied to the second oscillation transistor $2_1$, and an operating current does not flow via its collector-emitter path. Accordingly, the second voltage-controlled oscillation circuit 2 stops oscillating.

On the other hand, when mobile communication is performed using the GSM method, when the selector circuit 3 is selected so that the selectable oscillation circuit operates in the 900MHz band, a LOW selector signal is generated by the control unit (not shown) and is provided to the selector-signal supply terminal 6 of the selector circuit 3. When the selector circuit 3 receives the LOW selector signal, the first switching transistor $3_1$ is switched off and then the second switching transistor $3_2$ is switched on. At this time, since the second switching transistor $3_2$ is switched on, some currents flow through the emitter load resistor $2_2$ and the base-bias resistors $2_9$ and $2_{10}$. The currents that flow via the two base-bias resistors $2_9$ and $2_{10}$ cause a proper base-bias voltage to be applied to the base of the second oscillation transistor $2_1$. Because of the application of the proper base-bias voltage, an operating current flows via the collector-emitter path of the second oscillation transistor $2_1$. Accordingly, normal oscillation occurs in the second voltage-controlled oscillation circuit 2. The second oscillation signal, whose oscillation frequency is at 900 MHz is provided from the emitter of the second oscillation transistor $2_1$ via the coupling capacitor $2_6$ to the second oscillation-signal output terminal 5. Finally, the second oscillation signal is provided from the second oscillation-signal output terminal 5 to an application circuit (not shown).

At this time, since the first switching transistor $3_1$ is switched off, no current flows through either the emitter load resistor $1_2$ or the base-bias resistors $1_9$ and $1_{10}$. Since no current flows through the base-bias resistors $1_9$ and $1_{10}$ a proper base-bias voltage is not applied to the first oscillation transistor $1_1$, and the operating current does not flow through the collector-emitter path thereof. Accordingly, the first voltage-controlled oscillation circuit 1 stops oscillating.

Thus, according to the present invention, one of the first voltage-controlled oscillation circuit 1 and the second voltage-controlled oscillation circuit 2 is selectively switched to be active and the other to be inactive in accordance with whether the selector signal provided from the control unit to the selector-signal supply terminal 6 of the selector circuit 3 is the positive-HIGH or LOW. Accordingly, when either the first oscillation circuit 1 or the second oscillation circuit 2 is inactive, because no current flows through the base-bias resistors of the inactive oscillation circuit, there is no power consumption through the respective base-bias resistors, $1_9$ and $1_{10}$ or $2_9$ and $2_{10}$.

In the presently preferred embodiment, by way of example only, a selectable oscillation circuit, which is used in a cellular phone having both DCS and GSM modes, in which the frequency of the output oscillation signal from the first voltage-controlled oscillation circuit 1 is at 1700 MHz and the frequency of the output oscillation signal from the second voltage-controlled oscillation circuit 2 is at 900 MHz is described. However, the selectable oscillation circuit according to the present invention is not limited to the above-described cellular phone modes, and it may be used in other similar devices. The first and second voltage-controlled oscillation circuits 1 and 2 are not limited to the above-described frequency bands. As long as the frequency bands are appropriately discrete, other frequency bands may be used.

In the above-described embodiment, by way of example only, the two oscillation circuits are voltage-controlled oscillation circuits. However, the two oscillation circuits may include other types of oscillation circuits that generate oscillation signals of predetermined frequency bands.

What is claimed is:

1. A selectable oscillation circuit comprising:

a first oscillation circuit including a first oscillation transistor;

a second oscillation circuit including a second oscillation transistor; and a selector circuit including a first selector terminal connected to said first oscillation circuit and a second selector terminal connected to said second oscillation circuit, said selector circuit selectively switching on and off said first oscillation circuit and said second oscillation circuit in accordance with the provision of a selector signal, wherein:

said first selector terminal is connected to a grounding terminal of an emitter load and a grounding terminal of a base-bias resistor of said first oscillation transistor; and said second selector terminal is connected to a grounding terminal of an emitter load and a grounding terminal of a base-bias resistor of said second oscillation transistor.

2. The selectable oscillation circuit of claim 1, wherein:

said selector circuit includes a first transistor and a second transistor that are grounded-emitter type transistors and that are dependently direct-current-biased connected, a collector of said first transistor being connected to said first selector terminal and a collector of said second transistor being connected to said second selector terminal.

3. The selectable oscillation circuit of claim 2, wherein said first transistor and said second transistor are connected via a base-bias-supply circuit of said second transistor.

4. The selectable oscillation circuit of claim 2, wherein said selector circuit receives a selector signal at the base of said first transistor.

5. An oscillation circuit controlled by a selector circuit for selectively activating or deactivating said oscillation circuit, said oscillation circuit comprising:

an oscillation transistor, an emitter load, and a base-bias load, wherein said emitter load and said base-bias load are connected to together, on their respective grounding sides, and connected to said selector circuit such that when said oscillation circuit is deactivated, no current flows through said base-bias load.

* * * * *